US007305329B2

(12) United States Patent
Friedman et al.

(10) Patent No.: US 7,305,329 B2
(45) Date of Patent: *Dec. 4, 2007

(54) METHOD FOR LOBBY AND COMMON AREA INTERIOR

(76) Inventors: Jeffrey Friedman, 180 Riverside Blvd., New York, NY (US) 10069; Harold S. Friedman, 7 Gracie Sq., New York, NY (US) 10028

( * ) Notice: Subject to any disclaimer, the term of this patent is extended or adjusted under 35 U.S.C. 154(b) by 0 days.

This patent is subject to a terminal disclaimer.

(21) Appl. No.: 11/384,606

(22) Filed: Mar. 20, 2006

(65) Prior Publication Data

US 2006/0195304 A1    Aug. 31, 2006

Related U.S. Application Data

(63) Continuation-in-part of application No. 10/294,026, filed on Nov. 14, 2002, now Pat. No. 7,016,817.

(51) Int. Cl.
*G06F 17/50* (2006.01)
(52) U.S. Cl. .................. 703/1; 52/30; 187/401
(58) Field of Classification Search ............ 703/1; 52/30, 235, 274; 182/141; 187/401, 414; 446/137; 348/739; 382/100
See application file for complete search history.

(56) References Cited

U.S. PATENT DOCUMENTS

| 3,621,635 | A | * | 11/1971 | de Lange | 52/235 |
| 3,631,942 | A | * | 1/1972 | Brounn | 187/401 |
| 3,849,930 | A | * | 11/1974 | Stubbmann | 446/137 |
| 4,357,993 | A | * | 11/1982 | Halpern et al. | 187/401 |
| 5,207,295 | A | * | 5/1993 | Bialy et al. | 187/401 |
| 5,881,519 | A | * | 3/1999 | Newkirk | 52/274 |
| 6,122,391 | A | * | 9/2000 | Ringland et al. | 382/100 |
| 6,631,589 | B1 | * | 10/2003 | Friedman et al. | 52/30 |
| 2002/0113909 | A1 | * | 8/2002 | Sherwood | 348/739 |

OTHER PUBLICATIONS

AutoDesk Inc., AutoCad 14, User's Guide, Copyright 1998 AutoDesk Inc., pp. 8, 9, 25, 210, 602, 630 and 690.*
Harper, G.N. BOP—An Approach to Building Optimization, Proceedings of the 1968 23rd ACM National Conference, Jan. 1968, pp. 575-583.*
Turnage, R.B. A methodology for Evaluation of a Hospital's Vertical Transportation Needs, Proceedings of the 11th Conference on Winter Simulation, vol. 2, 1979, pp. 595-602.*

* cited by examiner

*Primary Examiner*—Russell Frejd

(57) ABSTRACT

A lobby or other public space design process for providing an attractive appearance complementary to a building in which the lobby is installed, by
 (a) Evaluating a building for determination of appropriate lobby interior design architecture and appearance,
 (b) Selecting a suitable design from a series of previously prepared design proposals, and
 (c) Selecting material for the decoration of the lobby interior for the design selected from a palette of previously prepared options for available material including selection of material type, color and design.

12 Claims, 13 Drawing Sheets
(13 of 13 Drawing Sheet(s) Filed in Color)

METHOD FOR LOBBY AND COMMON AREA INTERIOR

This application is a Continuation-in-Part of parent application Ser. No. 10/294,026 filed on Nov. 14, 2002 entitled "Method for Elevator Cab Interior", issued as U.S. Pat. No. 7,016,817 on Mar. 21, 2006.

FIELD OF INVENTION

The present invention relates to building construction and more particularly to an advantageous method of designing and constructing an attractive lobby or other public area at a reduced cost. This lobby design method reduces the burden, time commitment and cost of designing, manufacturing and installing a custom designed lobby.

BACKGROUND OF THE INVENTION

Traditional Methods of Lobby Design

Traditionally, there are three methods by which a lobby design is chosen. The method of selection is usually determined by the quality of the building: Rated from A down to C as illustrated below:

|  | "A" Building | "B" Building | "C" or Lesser |
|---|---|---|---|
| 1) Repair and refinish an existing Installation (existing buildings only) |  | 40% | 75% |
| 2) "Make it look like that building" (existing or new buildings) |  | 40% | 25% |
| 3) Hire an architect to create a new design (existing or new buildings) | 100% | 20% |  |

The first method of repairing and refinishing an existing installation is usually the lowest cost because most of the existing material is retained and little or no engineering and/or structural modifications are required. An architect or designer may be used to supply specifications and provide oversight of the project, but by definition there is little or no change in either the design or material. The major disadvantage of this method is that an existing design that is carried forward may contain many flaws, such as the design being in conflict with the other major public spaces in the building, the exterior or neighborhood, being dated or otherwise unattractive to a wide range of existing or potential tenants, or being expensive to maintain. Although this method may represent the simplest, fastest and least expensive method of updating a building's appearance, it often adds the least amount of value to the property and does the least to retain and attract tenants.

The primary advantage of the second method, to replicate an existing design, is that the design and cost will be fairly well known before the contract is put out to bid. This method is frequently used by property owners or managers who have purchased existing buildings or plan to construct new ones and who wish to maximize brand equity by using common design elements across their portfolio of properties. Even though an architect or designer is used to create the drawings and specifications, there are many opportunities for the buyer to get poor value for the money spent. For instance, if the original to be copied is poorly designed, the copy will be no better and may be quite expensive. Secondly, differences in the underlying space, such as dimensions and structural capacities may add additional cost to a project without enhancing the space. Finally, copying a design from one property to another may sometimes be inappropriate to the existing design elements of the building and its environs.

The third method, creating a custom design, may be the most effective way of enhancing the attractiveness of a building. As with the second method, an architect or designer is used to create the drawings and specifications. However, in this case, the architect or designer has greater flexibility in choosing both the design elements and materials for the space. This flexibility allows the designer the best chance of choosing an attractive design that is most suitable to the rest of the building and its environs. This attractive design is also useful in retaining and attracting new tenants.

There are serious drawbacks to using a custom designed lobby. For instance, the process can be very time consuming. At the outset, the owner and the designer may have completely different aesthetic and design visions for the project, a situation that is less likely to occur in the first and second methods discussed above. Without extensive, painstaking coordination, the designer's proposal may have design elements unacceptable to the project owner. Another problem is that although the designer is given a budget, there is no way to measure if the design is within the budget until most of the drawings and specifications are created and submitted to the suppliers for bids. The bids frequently come back above the budget and one or more modifications of the design and specifications may be necessary to get the project within the budget. Even if the project is within the budget, a large part of that budget may be consumed by engineering and procurement costs, rather than the purchase and delivery of the actual product. Additional time is needed with custom designs because of the necessity for suppliers to produce custom drawings and samples for approval and for custom materials to the jobsite.

SUMMARY OF THE INVENTION

Applicant proposes to change the way lobbies and other public spaces within a building are designed by providing a series of designs of high architectural quality, readily available premium materials and pre-engineered to reduce the cost and lead time.

Applicant's advantageous design method provides for the selection of attractive designs for lobbies for commercial, residential and institutional buildings. Applicant supplies the engineering and manufacturing expertise to guide the architectural design decisions and material selection that minimize the cost of material and labor neither of which directly contribute to the appearance and structural integrity of the lobby.

Applicant's method allows controlling the product cost by choosing from a materials palette of high-end products such as glass, stone, wood and textured metals in a limited range. These materials have been selected for their attractive appearance, reasonable cost and availability, thus maximizing the buying power for acquiring these materials at the lowest cost.

Building owners will save money by getting a product that costs as much as 25% less than lobbies constructed of similar materials and design would cost. They will be given the advantage of having a superior product enhancing the appearance of their buildings that will allow them to rent space more quickly and at higher prices.

With a limited palette of materials and photo-realistic renderings of lobby designs, the time-consuming project management of coordinating drawings, samples and mock-ups between the project owner, designer and contactor is reduced dramatically. Standard pricing and industry discounts will minimize unforeseen extras and insure a profit margin. The lead time for the lobby can be accurately predicted and will be less than projects that do not use this system of ease of selection and manufacturing standardization.

Independent architects and designers take on financial risks in custom lobby design projects because of the technical complexity and lengthy approval process. Now an architect or designer will be able to work together with the project owners and contractors from the start of a project in a coordinated and collaborative process, rather than having to work independently and lose time and money.

New Method Provides a New Financing Tool by an Operating Lease

In launching this product method, Applicant has found creative ways to maximize the sales volume. One new area of interest is to change the transaction for the end user from a large lump-sum capital investment into an affordable and predictable expense. By offering these lobbies through an operating lease, Applicant believes that there will be a three-fold benefit to the business:

1. Expanding the base of potential customers by reducing the cost and creating an attractive quality product available to building owners who lack the liquidity to pay for all this work at once.
2. Increasing the market share within this base by providing a unique alternative that may present substantial savings to the customer.
3. Raise the average selling price as customers trade up to more attractive designs and materials, because of the ability to spread the cost over time.

This invention discloses a method for drastically reducing the burden, time commitment and cost for designing, manufacturing and installing a building lobby or other public space. This method provides a way to upgrade the quality of the lobby materials, design and craftsmanship and at the same time reduce the costs of manufacturing and installing the lobby by as much as 33%. Real estate developers, building owners, architects and contractors can save time and money by ordering a customized lobby that can be viewed in advance and supplied sooner than by other methods.

The design method criteria takes into consideration the need for utilizing premium materials for the walls and ceiling without adding weight that the existing structural elements of the building cannot handle. This method provides a solution for a lobby that is 1) Innovative, 2) Custom made, 3) Time saving, 4) Easy to specify, 5) Easy to price and 6) Easy to install.

Materials to be chosen include stone, wood, glass and woven wire mesh. These materials can be used in hundreds of different combinations. Furthermore, using these materials allows the designer to complement any commercial, institutional or residential building's intrinsic design. Also, this method allows the incorporation of existing or upgrades of lobby materials. This method provides affordability without compromising quality.

The cost of the average lobby using Applicant's design is 30% less compared to a custom design using the same materials palette. In addition, the design incorporates a lighter weight construction so that expensive structural design modifications to the building required by excess weight are eliminated.

This advantageous method of lobby design provides an attractive appearance complementary to other elements of the building in which the lobby is installed, such as the exterior, other existing public spaces and elevator cabs. The building is evaluated for the selection of one or more options of lobby design incorporating budget, design elements and materials. A suitable design is selected from a Series of previously prepared design proposals. Finally, decorative materials for the lobby are selected from a palette of previously prepared options including selection of material type, color and design. The palette options include wood, metal mesh, stone and glass and the materials shown for selection from the palette include rectangular panel tiles. The materials shown for selection from the palette for a decorative wall which extends from floor to ceiling in height. The material for the other walls of the lobby is selected from rectangular panel tiles with decorative surfaces.

The method of lobby design includes providing the expertise of an experienced designer for selecting a suitable design from a Series of design proposals for said building and providing the expertise of an experienced designer for selecting the material for the decoration of the lobby from a palette of options for available material type and color.

This method of lobby design provides expertise in lobby design architecture and lobby decoration mechanical construction. The expertise is used to evaluate a building for determination of an appropriate lobby design. The expertise is used to select a suitable design from a Series of previously prepared design proposal. The expertise is then used for selecting the material for the decoration of the lobby from a palette of options for available material type and color. This expertise is then used to construct a lobby interior in accordance with the design and material selected.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF THE INVENTION

Three Designs

There are three basic designs to select from:
1. Series L200.
2. Series L300
3. Series L400

The Series L200

This design exhibits a center feature lobby wall panel which aligns with a bi-level ceiling featuring both direct and indirect lighting. Complementary wall panels complete the elegant design. FIG. 1 to 7 of the drawings illustrates the method shown for Series L200.

The Series L300

Figure 8:
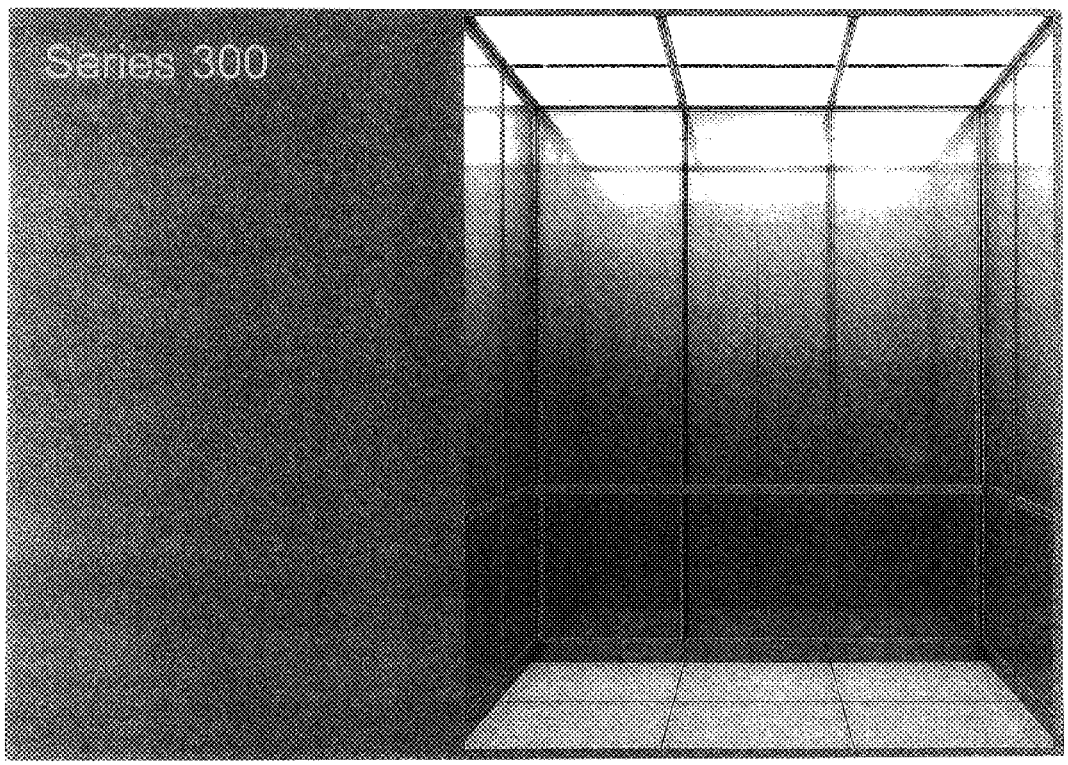
FIG. 8 is a perspective view that illustrates a Series L300 lobby wall design with three large upper back panels and the three smaller lower panels.

This paneled lobby wall features a traditional wainscot with the upper panels in either identical or complementary materials. The suspended ceiling is luminescent and segmented to align with the walls. FIG. 8 illustrates the Series L300 method.

The Series L400

Figure 9:
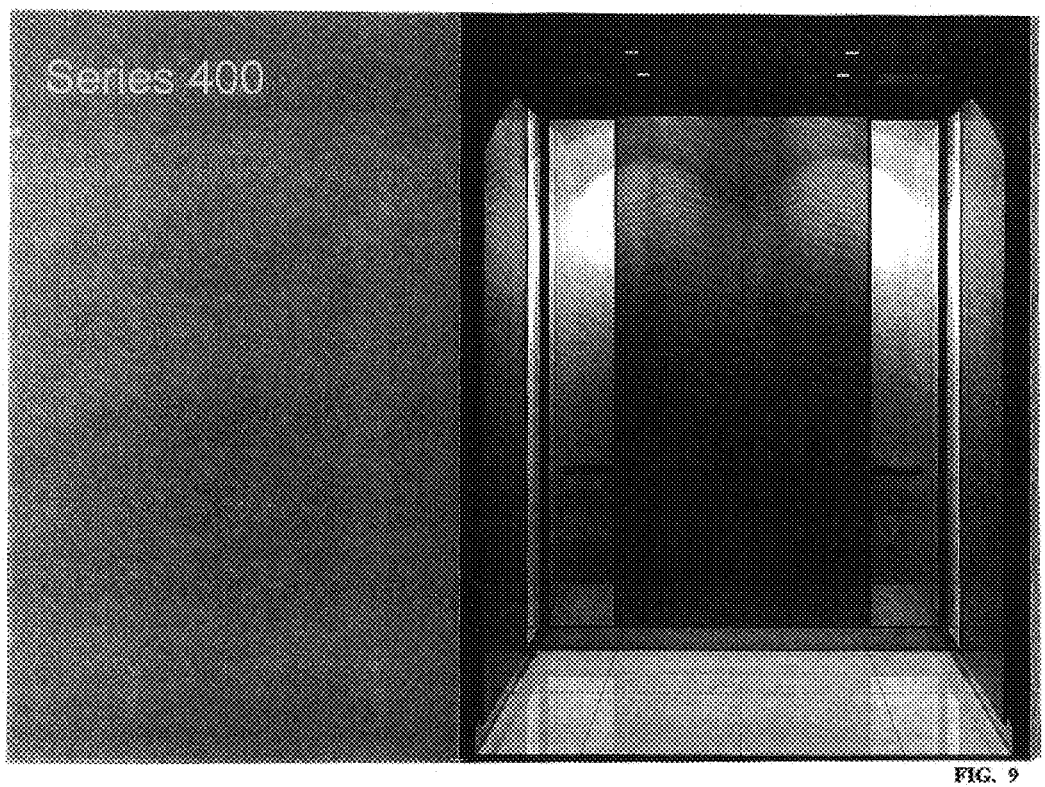
FIG. 9 is a perspective view that illustrates a Series L400 lobby interior with large wood design wall panels and large wood side wall panels extending from floor to ceiling.

This unique wall design is carried into a suspended ceiling. The center of the wall features segmented panels of complementary materials. The top of the wall panels are designed by an elegant metal grill. The lobby is lit by halogen downlights mounted on a suspended ceiling. FIG. 9 illustrates the design method for Series L400.

The Design

By utilizing pre-existing designs, the property owner reduces the design phase by eliminating the need for concept drawings, models and design review. This savings translates not only into shorter time frames, but fewer design hours and lower costs.

The Selection/Purchase Process

A simplified ordering process will yield a quotation in a matter of hours. A full color presentation is available within one week.

Wall Panel Material Options

| Material A | Material B |
| --- | --- |
| Glass | Glass |
| Glass | Stone |
| Glass | Mesh |
| Stone | Glass |
| Stone | Stone |

-continued

| Material A | Material B |
| --- | --- |
| Stone | Mesh |
| Mesh | Glass |
| Mesh | Stone |
| Mesh | Mesh |

Figure 10:
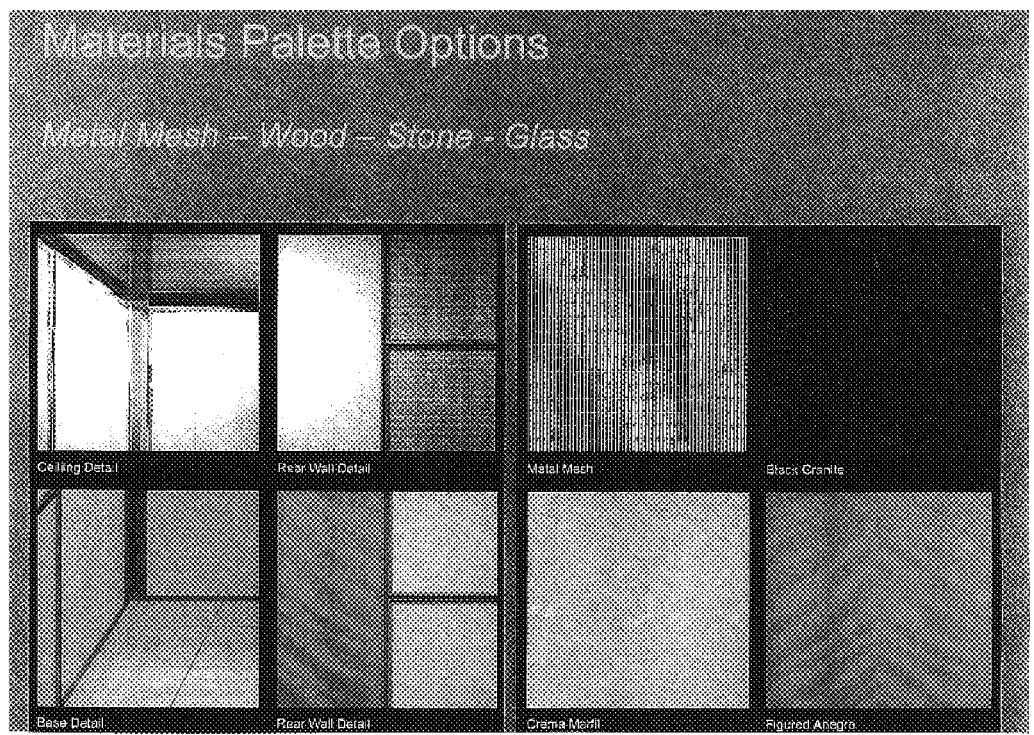
FIG. 10 illustrates a Materials Palette Options Selection display.

FIG. 10 illustrates the L options for the selection of these materials.

Figure 1:
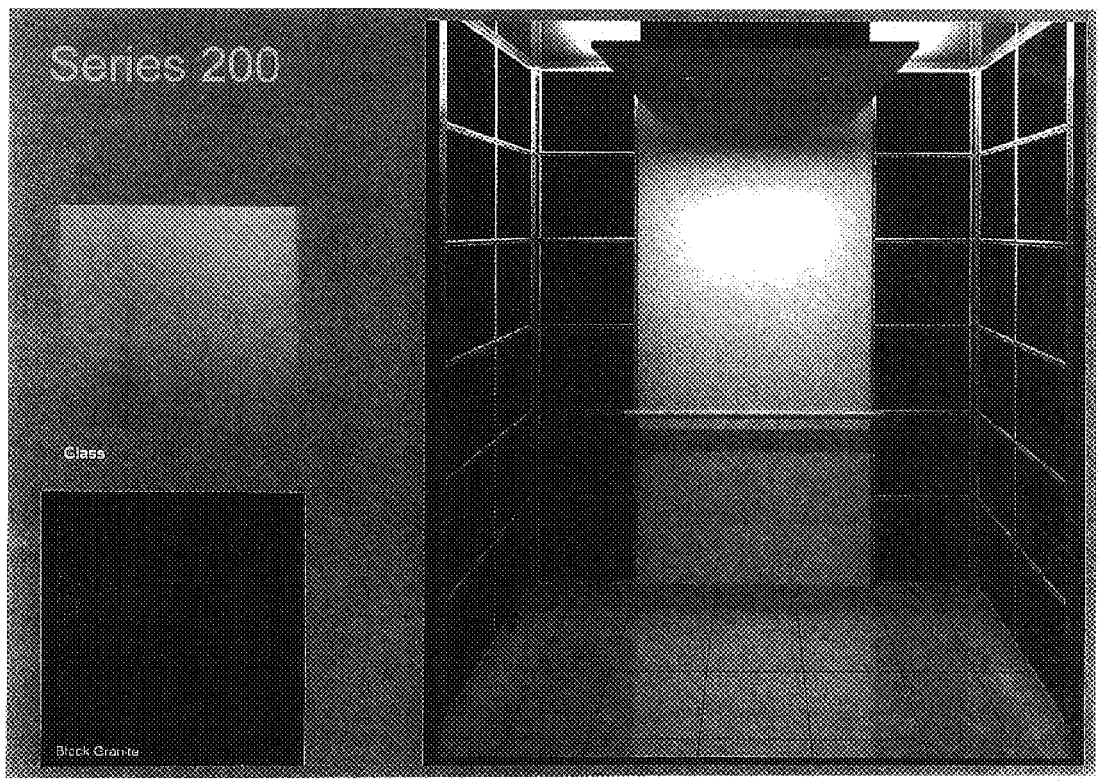
FIG. 1 is a perspective view that illustrates a Series L200 lobby interior design where glass is used for the back wall panel.

As shown in FIG. 1, the L200 Series design includes an interior wall panel for the lobby material. This panel extends from floor to ceiling. On either side of the wall panel are six (6) square panel tile vertical rows that run from floor to ceiling to complete the decoration of the wall. The vertical rows of panel tiles extend along the width of the walls of the lobby. As shown in FIG. 1 the wall panel is made up of glass panels and square panel tiles of black granite.

Figure 2:
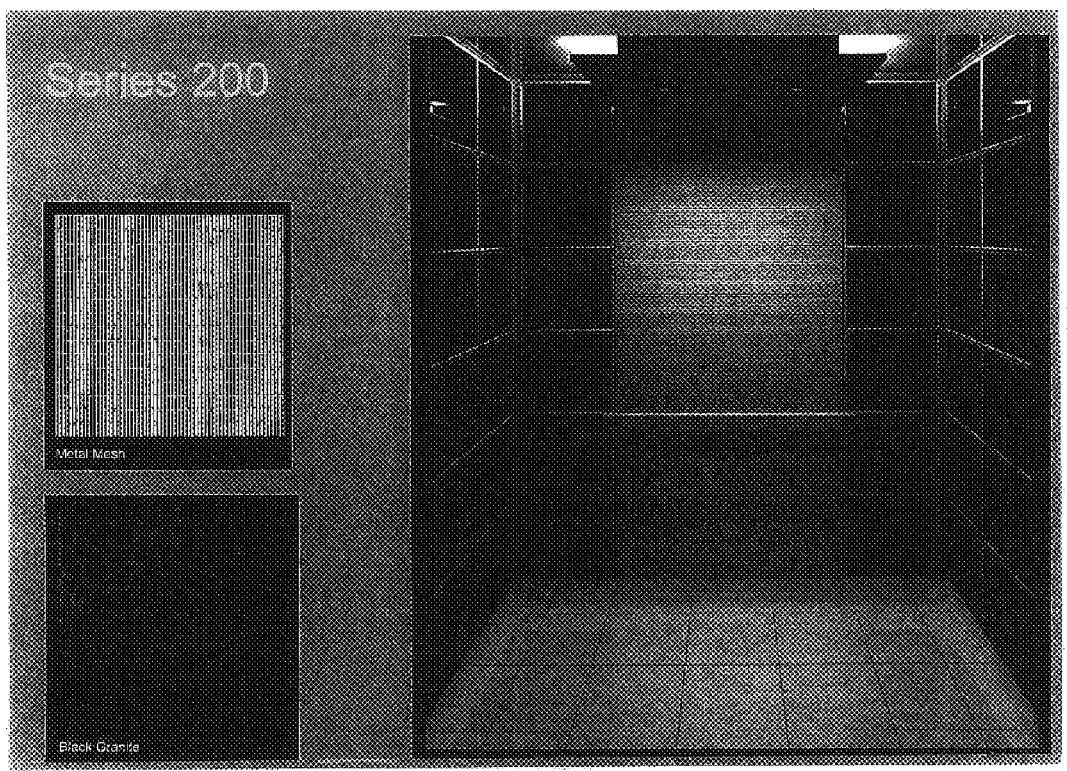
FIG. 2 is a perspective view that illustrates Series L200 lobby where metal mesh is used for a wall.

In FIG. 2 there is another decorative design scheme for Series L200 with different material selected from the Materials Palette Options of FIG. 10. Here the wall panel is made of metal mesh and the side panel tiles are made of black granite.

Figure 3:
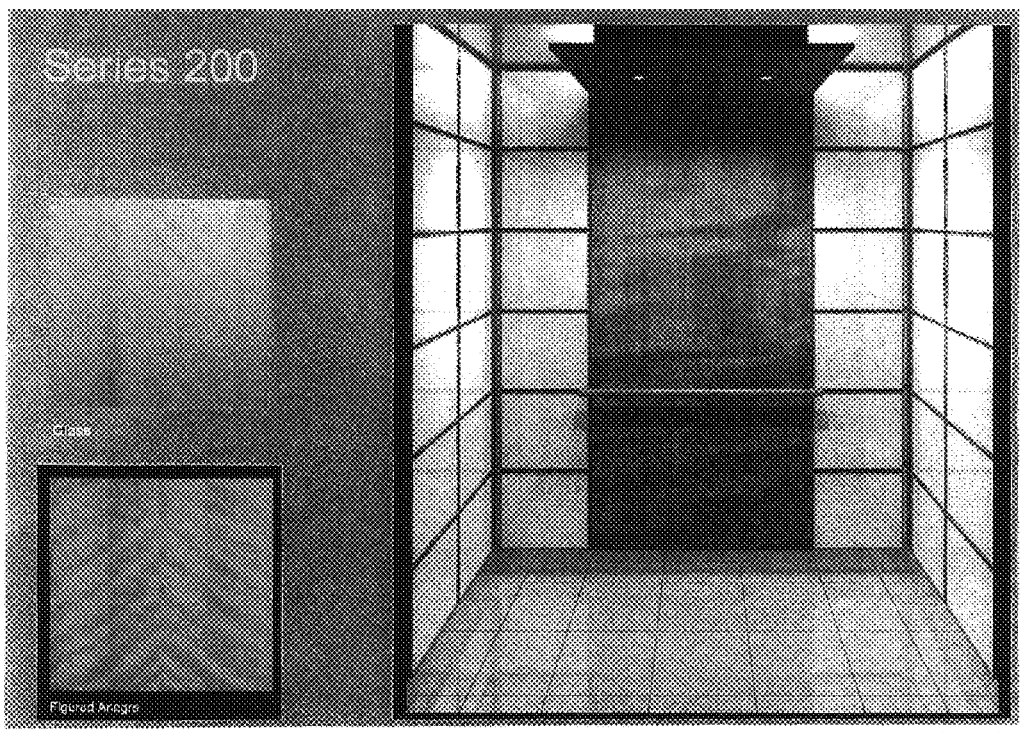
FIG. 3 is a perspective view that illustrates a Series L200 lobby where a Figured Anegre wood design is used for a wall.

In FIG. 3, the Series L200 design with a wall panel made of Figured Anegre wood design and tile panels made of glass have been selected from the Materials Palette Options of FIG. 10.

Figure 4:
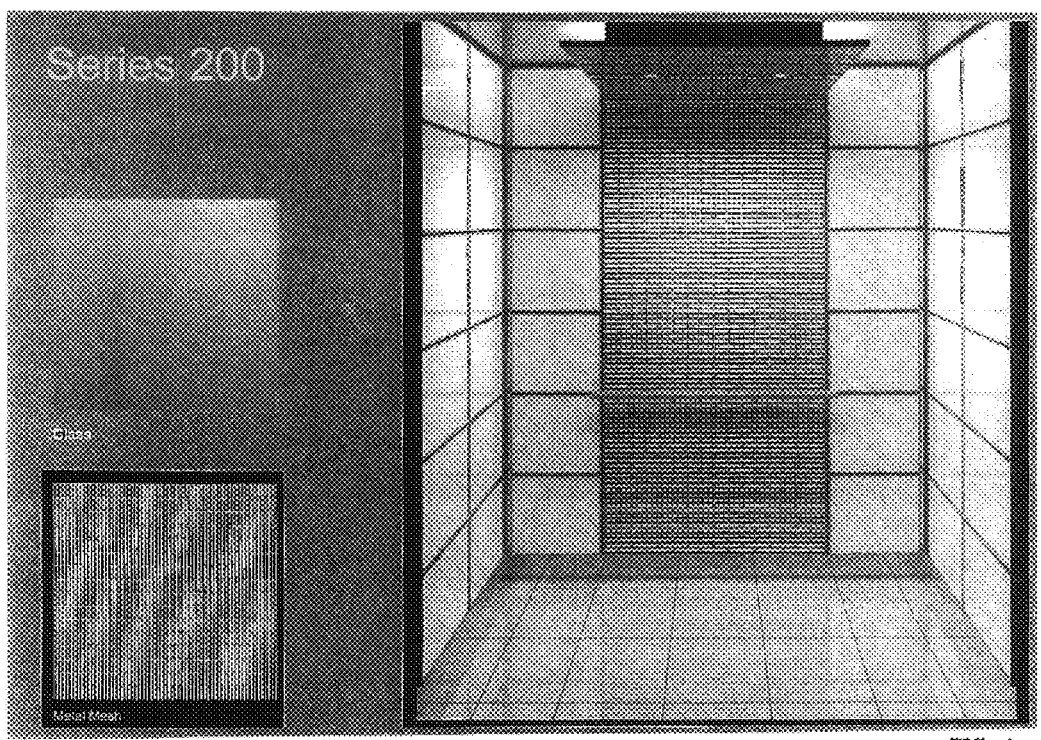
FIG. 4 is a perspective view that illustrates a Series L200 design where metal mesh is used for a wall and glass rectangular panel tiles are used on other walls.

FIG. 4 is a Series L200 design with a wall made of metal mesh. The panel tiles are made of glass.

Figure 5:
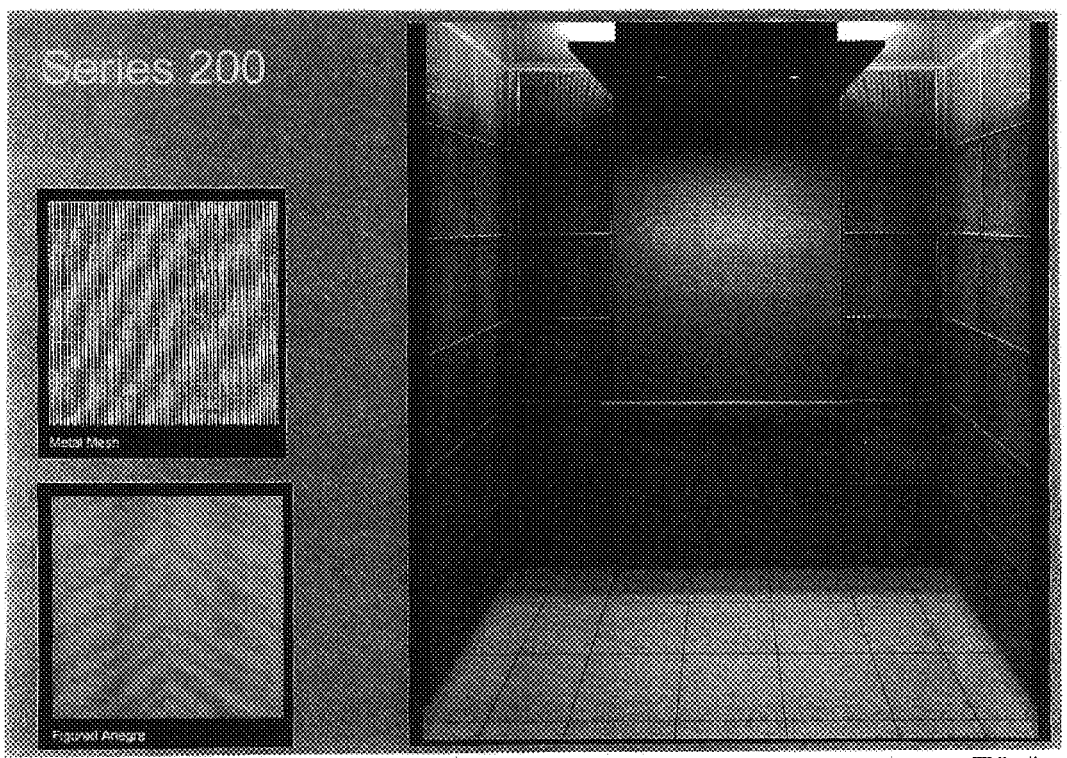
FIG. 5 is a perspective view that illustrates a Series L200 design where metal mesh is used for a wall and rectangular panel tiles of Figures Anegre wood design are used for other walls.
Figure 6:
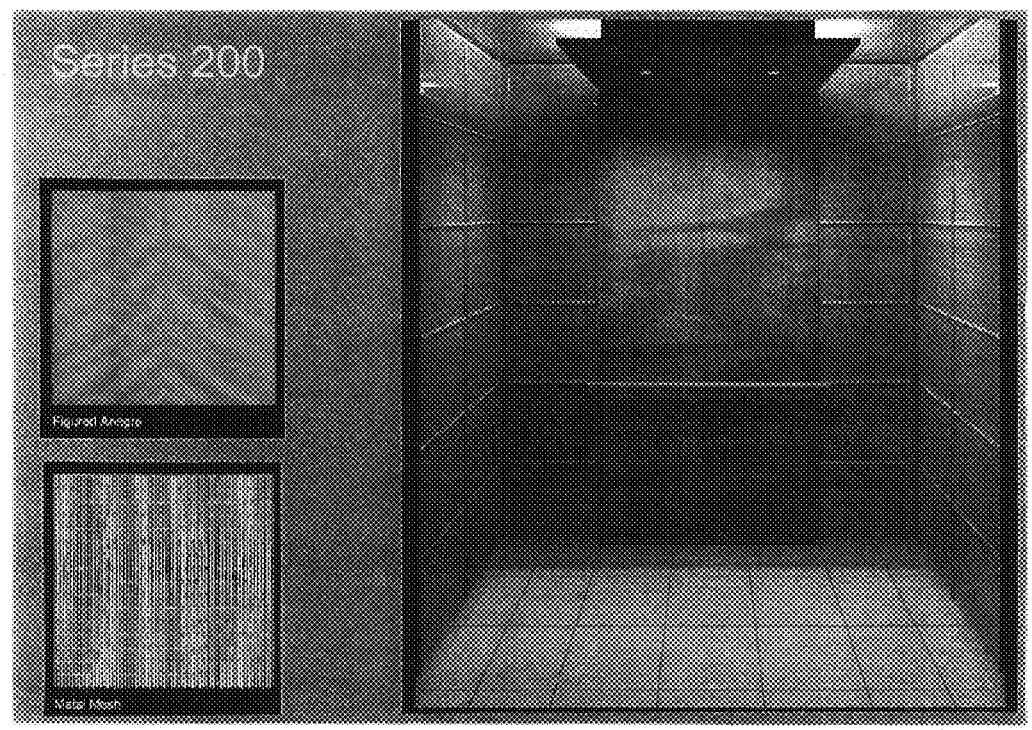
FIG. 6 is a perspective view that illustrates a Series L200 design where Figured Anegre wood and side rectangular panel tiles of metal mesh are used for a lobby wall.

Similarly FIG. 5 is a Series L200 design with a metal mesh wall and with the square panel tiles made of figured Anegre wood design. In contrast, FIG. 6 discloses a Series L200 design with a wall made of Figured Anegre wood design and the square panel tiles of metal mesh.

Figure 7:
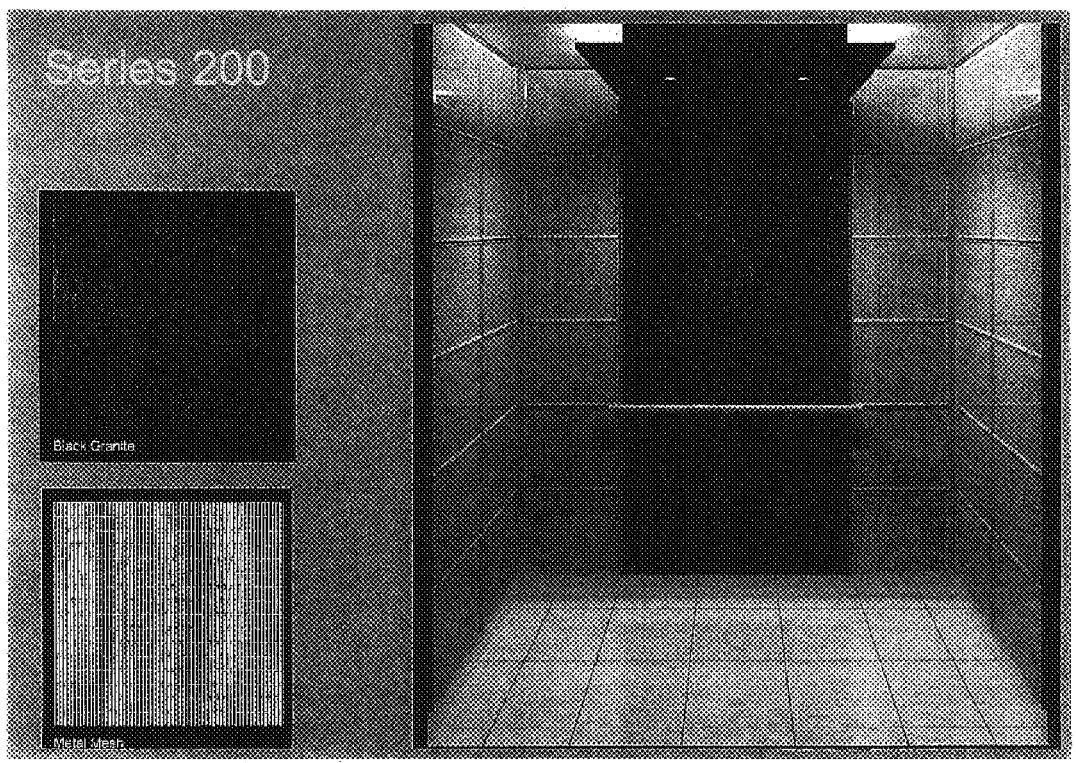
FIG. 7 is a perspective view that illustrates a Series L200 design for a lobby interior with a black granite back wall with rectangular side panel tiles of metal mesh.

Another variation of a Series L200 design is shown in FIG. 7 which illustrates a design with black granite wall and metal mesh square tile material.

FIG. 8 is a perspective view that discloses a Series L300 lobby wall with a six (6) wall panel having upper three rectangular panels which extend from the ceiling to approximately ⅔ down from the height of the wall and three square lower panels that extend from the floor to the upper panels. A mullin separates the upper and lower panels. The panels are made of glass.

FIG. 9 is a perspective view of a series L400 lobby design with large vertical wooden panels on the wall. On either side of the wall panels are elongated end panels which may be made of mirror or glass extending from floor to ceiling. There is a hand railing located on the wall.

FIG. 10 illustrates a Material Palette Options where the user can select a material such as wood, metal mesh, stone and glass panel for use in one of the previously selected designs. FIG. 10 also shows the lobby wall detail and lobby ceiling and base construction detail that can be selected as an option with a selected design.

Figure 11:
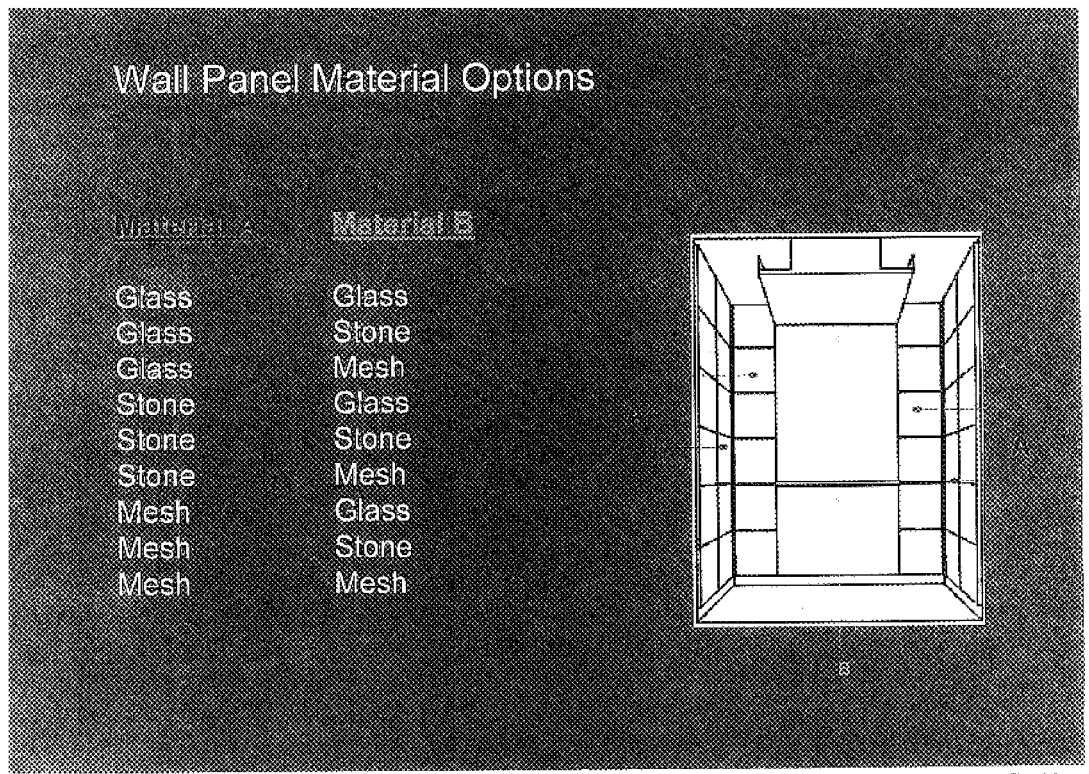
FIG. 11 illustrates a Wall Panel Material Options Guide.

FIG. 11 shows the wall panel material option chart showing various materials that can be used for the L200 series such as glass, stone, metal mesh and wood.

Figure 12:
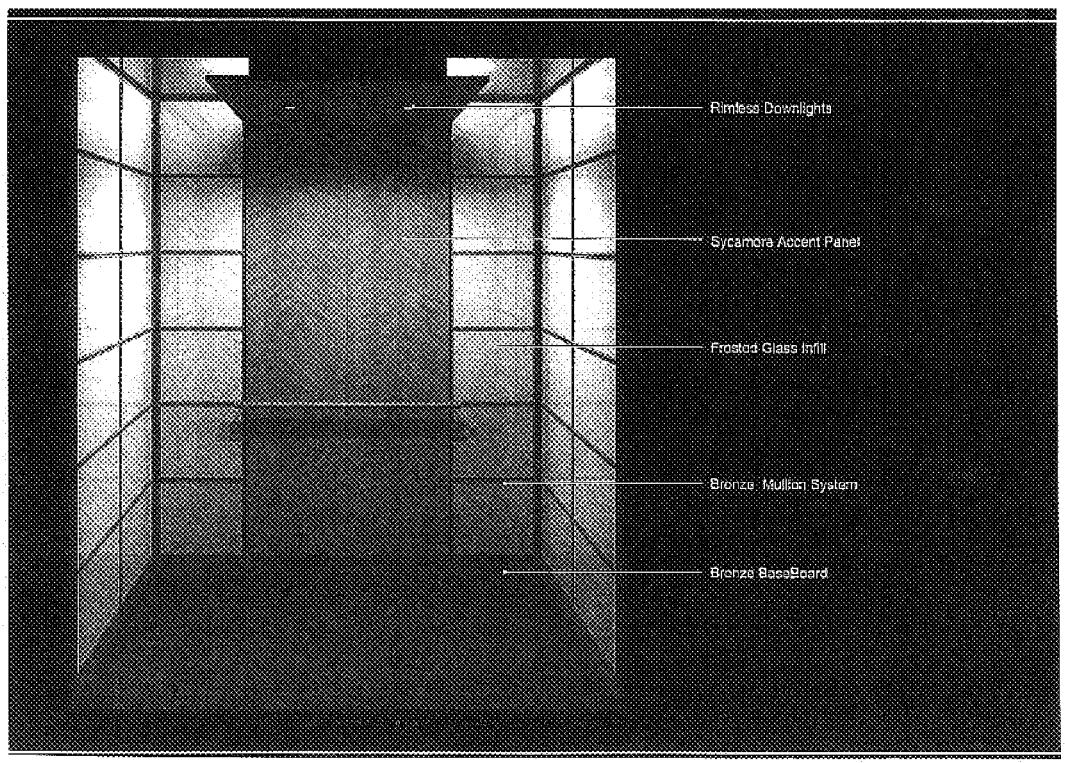
FIG. 12 is a perspective view that illustrates another Series L200 design which includes a bronze mullion and baseboard.

FIG. 12 discloses another Series L200 design which uses attractive bronze mullion and bronze baseboard along with rimless downlights. The wall is made of sycamore accent combined with frosted glass panel tiles.

Figure 13:
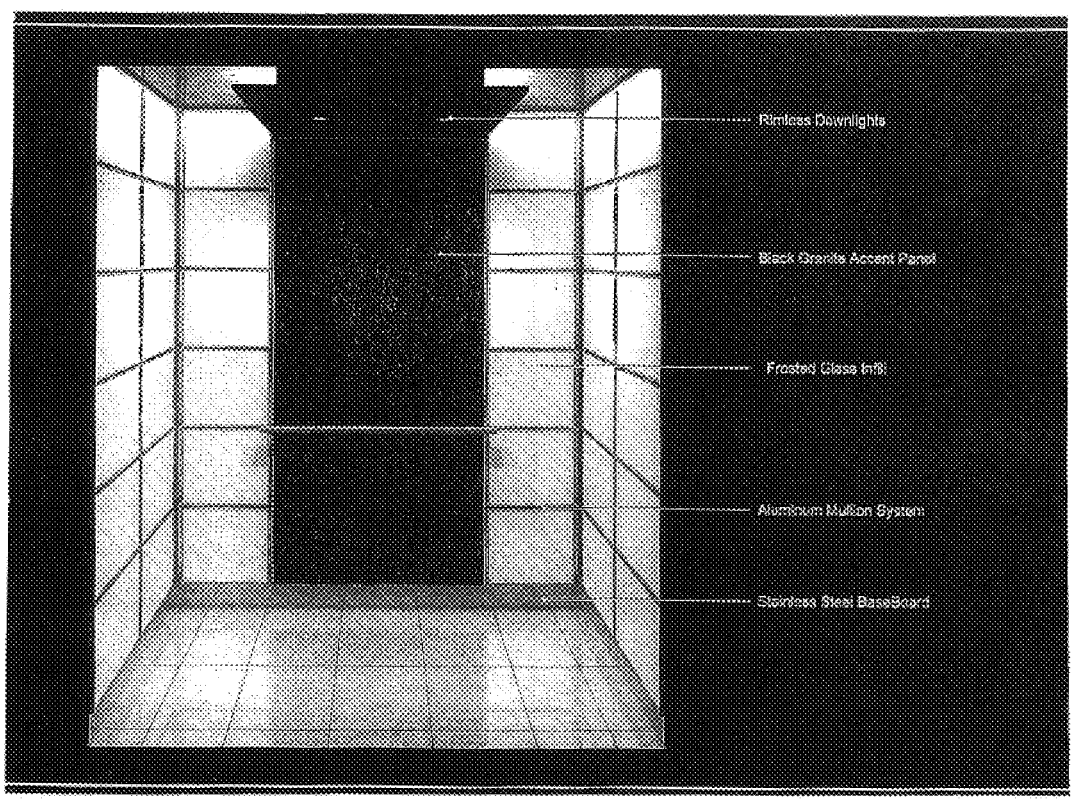
FIG. 13 is a perspective view that illustrates a further Series L200 design which includes an aluminum mullion and stainless steel baseboard.

FIG. 13 illustrates another variation of the L200 Series with aluminum mullions and stainless steel baseboards.

There the wall is decorated with a black granite back panel and square frosted tile panels.

Various designs and materials from FIGS. 1 to 13 may be combined to complete all the walls of the lobby or the designs of the selected series may be repeated to complete all the walls of the lobby.

Hypothetical Example of Use of Design Series L300

An institutional property owner had not hired an architect to design a building lobby.

Problem

Wanted a high quality lobby completed in a few months.

Solution

Working from the design method, the customer may find the appropriate design and materials from the illustrations of FIGS. 1-13 that is suited to their building. They could then pick out the metal, wood, stone and glass for the design from the Material Palette Options. Within a few weeks from the initial meeting a design may be selected.

Hypothetical Example of Use of Design Series L400

A major institutional property owner may want to upgrade an unpleasant looking building lobby.

Problem

Although approved, an initial design did not proceed due to budge constraints;

Solution

Two years later, Applicant's method was introduced and a Series L400 design could be selected. Material may be selected from the Material palette and the original budget could be lowered substantially.

Hypothetical Example

A building owner may hire an architect and an interior design firm to do a visual modernization of the building lobby design in a large Eastern city property.

The architect's design may be put out for bid. The Architect's bid which was competitive, was prohibitive because of a long manufacturing lead time.

Hypothetical Example

A building owner of an upscale suburban office building may decide to go ahead with a visual modernization of a lobby design. However, they only have a short period of time to complete the entire project due to capital budget requirements. Normally, selecting an architect, designing the lobby and putting the lobby design out to bid would take a number of months. With a time frame of 14-16 weeks to submit lobby design drawings for approval, the building owner could run out of time using such a traditional approach.

The building management used the present design method series L200 for lobby design. A half day survey of the existing lobby determined that a Series L200 lobby wall would be desirable. The building management is able to select stock materials from the material palette shown in the FIGS. 1-13 and get a quote for their design within a week. The building owner then could approve the project within a week so that the lobby could be installed in a timely manner.

Hypothetical Example

For more than three years, a building owner struggled to find an acceptable plan to visually modernize a building lobby in a classic style building. The existing lobby walls were done in an unpleasant plastic laminate design that was entirely inappropriate. Despite a number of design proposals by both in-house and outside professionals, the building owner was unable to come up with a design that was architecturally attractive with the overall cost kept down.

Finally, by using the present design method, the building owner selected a Series L200 lobby design. In just two meeting the building owner selected materials and approved the project which was well within the budget for the building.

I claim:

1. A method of lobby design including:
   (a) Evaluating a building for determination of an appropriate lobby design;
   (b) Providing expertise of an experienced designer for selecting a suitable design from a series of previously prepared design proposals for said building;
   (c) Providing expertise of an experienced designer for selecting the material for the decoration of the lobby from a palette of options for available material type and color; and
   (d) Constructing the lobby in accordance with the design and material selected,
   wherein a first wall panel design is selected from said prepared design proposals for a portion of a wall of said lobby and a second wall panel design is selected from said prepared design proposals for an adjacent area of said first wall.

2. The design method of claim 1 wherein the material palette option materials include wood, metal mesh, stone and glass.

3. The design method of claim 1 wherein the material shown for selection from the palette includes rectangular panel tiles.

4. The design method of claim 1 wherein the decoration for a first lobby wall is selected from said design proposals for a wall which extends from floor to ceiling in height and extends to more than ⅓ of the width of the said first lobby wall.

5. The design method of claim 1 wherein the remaining portion of the said first lobby wall is selected from rectangular panel tiles with decorative surfaces.

6. A method of lobby design including:
   (a) Evaluating a building for determination of an appropriate lobby design;
   (b) Providing expertise of an experienced designer for selecting a suitable design from a series of previously prepared design proposals for said building;
   (c) Providing expertise of an experienced designer for selecting the material for the decoration of the lobby from a palette of options for available material type and color; and
   (d) Constructing the lobby in accordance with the design and material selected,
   wherein the material for a second wall of said lobby is selected from said material palette of rectangular panels with decorative surfaces of the same design and color as the rectangular panels of a first lobby wall.

7. A method of lobby design including:
   (a) Providing expertise in lobby architecture and mechanical construction;
   (b) Evaluating a building with said expertise for determination of an appropriate lobby design;
   (c) Using said expertise for selecting a suitable design from a series of previously prepared design proposals for said building;

(d) Using said expertise for selecting the material for the decoration of the lobby from a palette of options for available material type and color; and (e) Constructing the lobby in accordance with the design and material selected, wherein a first wall panel design is selected from said prepared design proposals for a portion of a wall of said lobby and a second wall panel design is selected from said prepared design proposals for an adjacent area of said first wall.

8. The design method of claim 7, wherein the material palette option materials include wood, metal mesh, stone and glass.

9. The design method of claim 7, wherein the material shown for selection from the palette includes rectangular panel tiles.

10. The design method of claim 7, wherein the decoration for a first lobby wall is selected from said design proposal for a wall which extends from floor to ceiling in height and extends to more than $\frac{1}{3}$ of the width of said first lobby wall.

11. The design method of claim 7, wherein the remaining portion of said first lobby wall is selected from rectangular panel tiles with decorative surfaces.

12. The design method of claim 7 wherein material for another of the walls of said lobby are selected from said material palette of rectangular panels with decorative surfaces of the same design and color as the rectangular panels of said first lobby wall.

* * * * *